(12) United States Patent
Brown et al.

(10) Patent No.: US 9,133,022 B2
(45) Date of Patent: Sep. 15, 2015

(54) STRUCTURES COMPRISING HIGH ASPECT RATIO MOLECULAR STRUCTURES AND METHODS OF FABRICATION

(75) Inventors: David P. Brown, Helsinki (FI); Bradley J. Aitchison, Helsinki (FI); Albert G. Nasibulin, Espoo (FI); Esko I. Kauppinen, Helsinki (FI)

(73) Assignee: Canatu Oy, Helsinki (FI)

( * ) Notice: Subject to any disclaimer, the term of this patent is extended or adjusted under 35 U.S.C. 154(b) by 892 days.

(21) Appl. No.: 13/146,249

(22) PCT Filed: Jan. 27, 2010

(86) PCT No.: PCT/FI2010/050045
§ 371 (c)(1),
(2), (4) Date: Oct. 6, 2011

(87) PCT Pub. No.: WO2010/086504
PCT Pub. Date: Aug. 5, 2010

(65) Prior Publication Data
US 2012/0021191 A1    Jan. 26, 2012

(30) Foreign Application Priority Data
Jan. 28, 2009 (FI) ..................................... 20095076

(51) Int. Cl.
*B29C 65/00* (2006.01)
*B32B 37/14* (2006.01)
(Continued)

(52) U.S. Cl.
CPC ............... *B81C 99/0085* (2013.01); *B82B 3/00* (2013.01); *B82Y 30/00* (2013.01); *B82Y 40/00* (2013.01); *B81B 2203/0127* (2013.01); *H01S 3/0057* (2013.01); *Y10T 428/24802* (2015.01)

(58) Field of Classification Search
CPC ............... B81C 99/0085; B81B 2203/0127; B82B 3/00; B82Y 30/00; B82Y 40/00; H01S 3/0057; C09J 6/00; B32B 37/12; B32B 38/10; B29C 63/0095; B29C 65/48; B29C 65/50; H01L 21/6835
USPC ................... 156/230, 234–237, 241, 247, 249
See application file for complete search history.

(56) References Cited

U.S. PATENT DOCUMENTS

| | | |
|---|---|---|
| 2004/0007528 A1 | 1/2004 | Bakajin et al. |
| 2004/0197546 A1 | 10/2004 | Rinzler et al. |

(Continued)

FOREIGN PATENT DOCUMENTS

| | | |
|---|---|---|
| EP | 1 020 888 A1 | 7/2000 |
| EP | 1 630 128 A1 | 3/2006 |

(Continued)

OTHER PUBLICATIONS

Wu, Z. et al. "Transparent, Conductive Carbon Nanotube Films", Science, vol. 305, Aug. 27, 2004, pp. 1273-1276.
Hennrich, F. et al. "Preparation, characterization and applications of free-standing single walled carbon nanotube thin films", Phys. Chem. Chem. Phys., vol. 4, 2002, pp. 2273-2277.

(Continued)

*Primary Examiner* — Sing P Chan
(74) *Attorney, Agent, or Firm* — Merchant & Gould P.C.

(57) ABSTRACT

A structure comprising high aspect ratio molecular structures (HARM-structures), wherein the structure comprises an essentially planar network (2) of HARM-structures, and a support (3) in contact with the network (2). The support (3) has an opening (5) therein, at the peripheral region (4) of which opening (5) the network (2) is in contact with the support (3), such that the middle part of the network (2) is unsupported by the support (3). The network (2) comprises essentially randomly oriented HARM-structures.

6 Claims, 5 Drawing Sheets

Figure 1A:
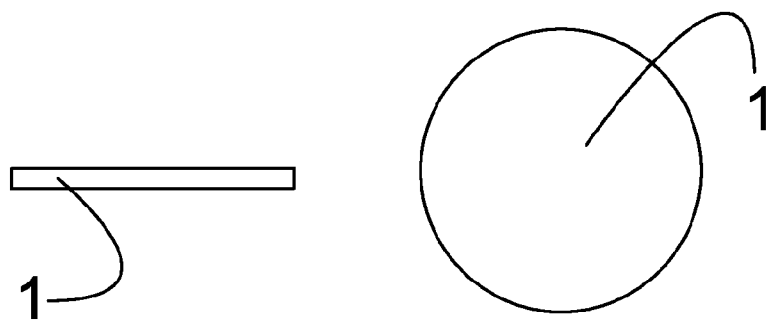

(51) Int. Cl.
  *B32B 38/10*    (2006.01)
  *B81C 99/00*    (2010.01)
  *B82B 3/00*     (2006.01)
  *B82Y 30/00*    (2011.01)
  *B82Y 40/00*    (2011.01)
  *H01S 3/00*     (2006.01)

(56) References Cited

U.S. PATENT DOCUMENTS

2008/0170982 A1   7/2008   Zhang et al.
2008/0248235 A1  10/2008   Feng et al.
2009/0169819 A1   7/2009   Drzaic et al.

FOREIGN PATENT DOCUMENTS

KR    10-0828477 B1     5/2008
WO   WO 2008/118201 A2  10/2008
WO   WO 2009/000969 A1  12/2008

OTHER PUBLICATIONS

Itkis, M. et al. "Bolometric Infrared Photoresponse of Suspended Single-Walled Carbon Nanotube Films", Science, vol. 312, Apr. 21, 2006, pp. 413-416.
Aliev, A. et al. "Thermal transport in MWCNT sheets and yarns", Carbon, vol. 45, 2007, pp. 2880-2888.
Wang, D. et al. "Highly oriented carbon nanotube papers made of aligned carbon nanotubes", Nanotechnology, vol. 19, 2008, pp. 1-6.
International Search Report for corresponding International Patent Application Serial No. PCT/FI2010/050045 mailed May 4, 2010.
Finnish Search Report for corresponding Finnish Patent Application No. 20095076 mailed Nov. 16, 2009.
Japanese Office Action for corresponding Japanese Patent Application No. 2011-546895 mailed Jan. 7, 2014 with English translation.
Taiwanese Office Action for corresponding Taiwanese Patent Application No. 099102211 mailed Oct. 20, 2014.
Extended European Search Report for corresponding European Patent Application No. 10735512.5 mailed Oct. 22, 2014.
Heras, A. et al., "Flexible optically transparent single-walled carbon nanotube elctrodes for UV-Vis absorption spectroelectrochemistry", *Electrochemistry Communications*, 11: 442-445 (2009).

STRUCTURES COMPRISING HIGH ASPECT RATIO MOLECULAR STRUCTURES AND METHODS OF FABRICATION

This application is a National Stage Application of PCT/FI2010/050045, filed 27 Jan. 2010, which claims benefit of Serial No. 20095076, filed 28 Jan. 2009 in Finland and which applications are incorporated herein by reference. To the extent appropriate, a claim of priority is made to each of the above disclosed applications.

FIELD OF THE INVENTION

The present invention relates to film deposition technology. Especially the present invention relates to film structures comprising high aspect ratio molecular structures.

BACKGROUND OF THE INVENTION

Carbon nanotubes (CNTs) possess unique electrical, optical, thermal and mechanical properties, which make them a promising material for many applications. A problem associated with the use of carbon nanotubes in these applications is that the fabrication and handling of stand alone (free-standing) films comprising carbon nanotubes, or other high aspect ratio molecular (HARM) structures such as carbon nano-buds (a molecule having a fullerene molecule covalently bonded to the side of a carbon nanotube), cellulose fibers, nanowires, nanorods etc., is very challenging with the methods of the prior art. Free-standing films of HARM-structures are needed in various electrical and mechanical device-applications to reduce detrimental effects to the operation of the device caused by a solid substrate over which the film (or network) of HARM-structures resides.

A known method for fabricating free-standing films comprising carbon nanotubes is to vertically grow CNTs as "forests" on a substrate and then to draw a film of these nanotubes from the surface so that individual CNTs contact each other forming a mechanically robust free-standing nanotube sheet called buckypaper. An example of this method is disclosed in scientific publication "Carbon, vol. 45 (2007), pp. 2880-2888". Another fabrication technique of buckypaper sheets is often referred to as the "domino pushing formation" in which a very thin microporous membrane is placed on top of a CNT array and then a steel cylinder is pushed slowly across the sample. This knocks all the CNTs over in the same direction and flattens them between the membrane and silicon substrate. Next, the membrane and the buckypaper are peeled off the silicon substrate and the membrane is removed, resulting in highly aligned free-standing buckypaper (Nanotechnology 19 (2008) 075609, pp. 1-6).

A drawback of the free-standing buckypaper sheet is that the nanotube molecules are aligned in the sheet, which limits the possibilities to apply the buckypaper material to different electrical devices or to other applications. Furthermore, due to the domino pushing or pulling formation mechanism of the buckypaper, it is challenging to synthesize very thin, very transparent and homogeneous layers of buckypaper with the known synthesis methods. Moreover, fabrication of free-standing buckypaper of single walled CNTs is still a challenging task.

PURPOSE OF THE INVENTION

A purpose of the present invention is to reduce the aforementioned technical problems of the prior-art by providing new types of structures comprising high aspect ratio molecular structures and methods for fabricating these structures.

SUMMARY OF THE INVENTION

The product according to the present invention is characterized by what is presented in independent claim 1.

The method according to the present invention is characterized by what is presented in independent claim 4.

The use according to the present invention is characterized by what is presented in claim 10.

A structure according to the present invention comprises high aspect ratio molecular structures (HARM-structures), wherein the structure comprises an essentially planar network of HARM-structures, and a support in contact with the network. The support has an opening therein, at the peripheral region of which opening the network is in contact with the support, such that the middle part of the network is unsupported by the support. The network comprises essentially randomly oriented HARM-structures.

A method according to the present invention for fabricating a structure comprising high aspect ratio molecular structures (HARM-structures), comprises the steps of
fabricating an essentially planar network of HARM-structures on a preliminary substrate by depositing HARM-structures onto the preliminary substrate;
placing the network on the preliminary substrate in proximity to a support having an opening therein;
transferring the network onto the support, such that the network contacts the support at the peripheral region of the opening in the support, and the middle part of the network is unsupported by the support; and
removing the preliminary substrate from the network.

A method according to the present invention for fabricating a structure comprising high aspect ratio molecular structures (HARM-structures), comprises the steps of
fabricating an essentially planar network of essentially randomly oriented HARM-structures on a preliminary substrate by depositing HARM-structures onto the preliminary substrate,
bringing the network on the preliminary substrate in proximity to a support having an opening therein;
transferring the network onto the support, such that the network contacts the support at the peripheral region of the opening in the support, and the middle part of the network is unsupported by the support; and
removing the preliminary substrate from the network. The structure according to the present invention is used in a device selected from the group of optical element in a laser, light pulse shaper, audio loudspeaker, aerosol particle filter, gas filter, pressure sensor, flow sensor, particle sensor, gas sensor, electromagnetic receiver and antenna.

In a laser or in a light pulse shaper the structure according to the present invention can eliminate negative effects to the operation of the device caused by a substrate. The negative effects may be e.g. optical absorption and reflection from the interfaces of the substrate. The structure also removes heat transfer limitations possibly caused by a substrate, which limitations may degrade the performance of the HARM-network in e.g. a saturable absorber in an optical device.

In mechanical filtering applications, such as particle or gas filters, the structure according to the present invention provides the advantage of good functionality. The filter screen, i.e. the network of HARM-structures, can be functionalized during its synthesis process to incorporate functional, e.g. anti-bacterial groups, to the high aspect ratio molecules. The filter screen can also be easily heated, e.g. resistively, to clean and/or to sterilize the screen after a filtering process. In a loudspeaker a structure according to the present invention enables a fast response time and therefore a wide bandwidth operation as a result of improved thermal dissipation.

In sensor applications the network of HARM-structures in the structure according to the present invention provides fast access to the sensing surface, large sensing surface area and good sensitivity, as the sensing part of the sensor.

The structure and the method of the present invention surprisingly provide a network of HARM structures which is partially supported from the sides of the essentially planar network while the middle part of the network is unsupported (i.e. free-standing). The HARM network (the network of HARM structures) in the structure can therefore be considered "semi free-standing".

The "semi free-standing" network and the related fabrication method provide several advantages. The "semi free-standing" network can be easily manipulated and/or stored on the support. The fabrication method and the "semi free-standing" structure are suitable for very thin and very transparent networks of material comprising HARM-structures. The "semi free-standing" network also enables easy incorporation of the network into various device structures. The fabrication of the structure according to the present invention can be realized, as an example only, by suitably choosing the support and the preliminary substrate such that the surface energy of the support is higher than the surface energy of the preliminary substrate. This can be used to cause a net attractive force of the network to the support from the preliminary substrate.

In one embodiment of the invention the network comprises essentially randomly oriented HARM-structures. The method of the present invention enables the fabrication of "semi free-standing" networks of HARM-structures where individual high aspect ratio molecules, e.g. CNTs or even single walled CNTs, may be randomly oriented. This is in contrast to e.g. buckypaper where the CNTs are essentially aligned. The random orientation of individual molecules has many advantageous effects e.g. to the properties of the network of HARM-structures. These effects include, but are not limited to, high electrical and thermal conductivity, isotropic electrical and thermal conductivity, good mechanical stability and durability, high uniformity in thickness and in porosity, large surface area and chemical reactivity, good solid, thermal, electrical, optical and fluid mechanical isotropy, and good control over the aforementioned properties.

In one embodiment of the invention the support is an essentially planar slide, wherein the opening is a hole in the middle part of the slide. This shape of the support is suitable for a simple transfer of the HARM network from the preliminary substrate onto the support. It is additionally straightforward to fabricate supports with this shape by e.g. removing a section from a middle part of a thin slide of polymer or glass.

In another embodiment of the invention the network comprises essentially randomly oriented HARM-structures selected from the group of carbon nanotube molecules and carbon nanobud molecules. Due to e.g. their high mechanical strength CNTs lend themselves well for the fabrication of the "semi free-standing" network of the present invention. A network of CNTs has also many important properties that make a network of CNTs especially suitable for applications in the field of e.g. manufacturing technology, electronics, optics, filtration and purification, acoustics, material technology and even biotechnology. Such properties include high aspect ratio, small diameter, high mechanical strength, and high thermal and electrical conductivity.

In one embodiment of the invention the step of bringing the network on the preliminary substrate in proximity to a support having an opening therein, comprises depositing the network onto the preliminary substrate being in proximity to the support.

In one embodiment of the invention the method according to the present invention comprises the step of, placing the network on the support into gas flow, such that gas is guided through the network and through the opening in the support, for modifying the network. The partly (or semi) free-standing structure according to the present invention lends itself well to gas-phase processing and modification as the network on the support can be placed in a gas flow, and the processing gases can be easily guided through the network and through the opening in the support.

In another embodiment of the invention the method according to the present invention comprises the step of, placing liquid onto the network on the support such that the liquid is wicked to cover the network. This can be used to e.g. modify or improve the mechanical, optical, thermal or electrical properties of the network.

In another embodiment of the invention, the liquid is a solvent in which a solute is dissolved in it.

In yet another embodiment of the invention the method according to the present invention comprises the steps of,
placing the network residing on the support into contact with a tertiary substrate, wherein the surface energy of the tertiary substrate is lower than the surface energy of the preliminary substrate, and
transferring the network from the support to the tertiary substrate.

The embodiments of the invention described hereinbefore may be used in any combination with each other. Several of the embodiments may be combined together to form a further embodiment of the invention. A product, a method or a use, to which the invention is related, may comprise at least one of the embodiments of the invention described hereinbefore.

DETAILED DESCRIPTION OF THE INVENTION

Figure 1B:
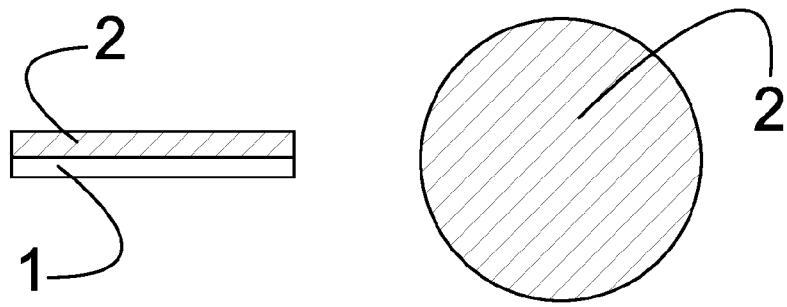
Figure 1C:
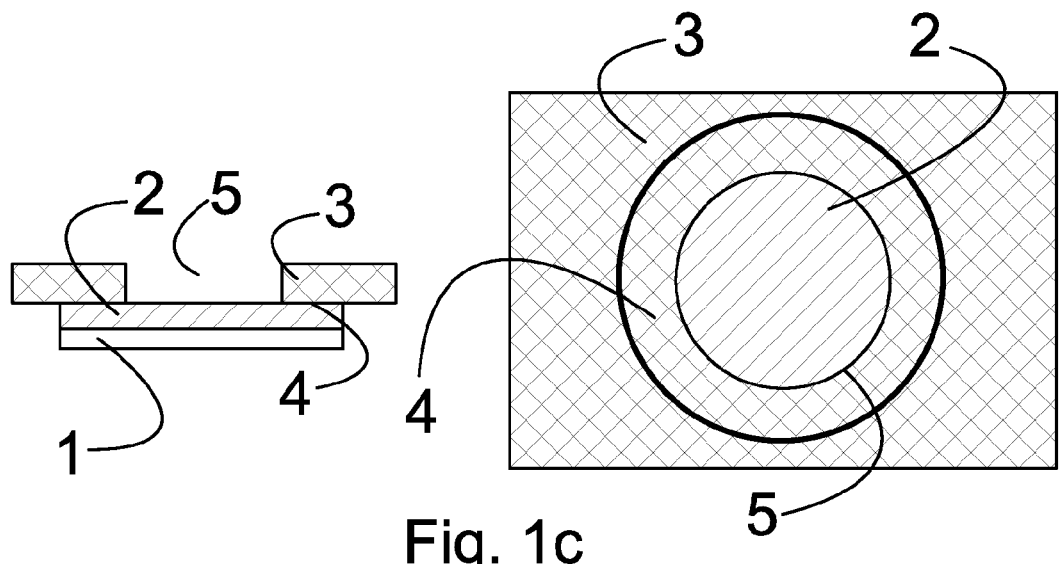
Figure 1D:
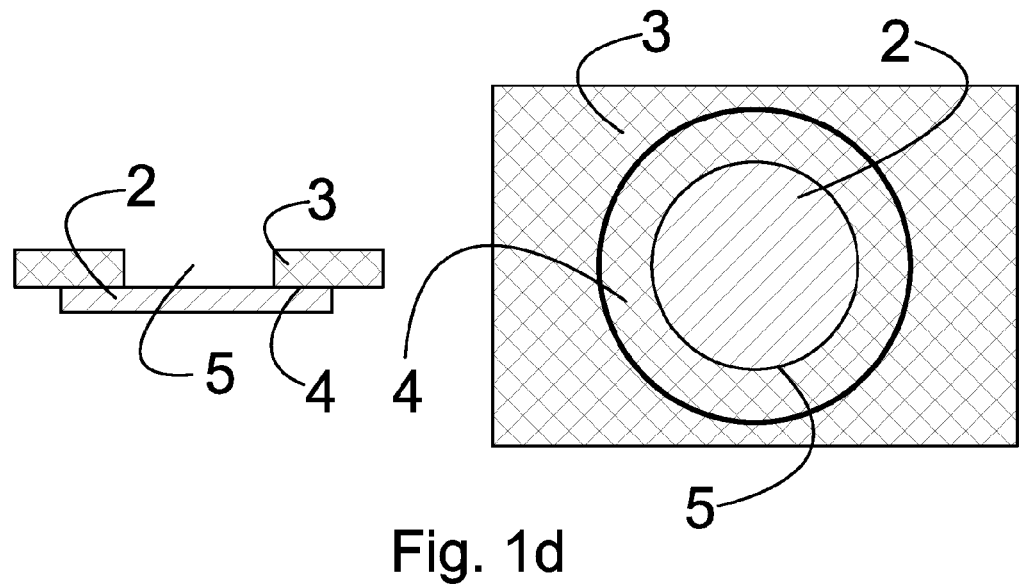
Figure 2A:
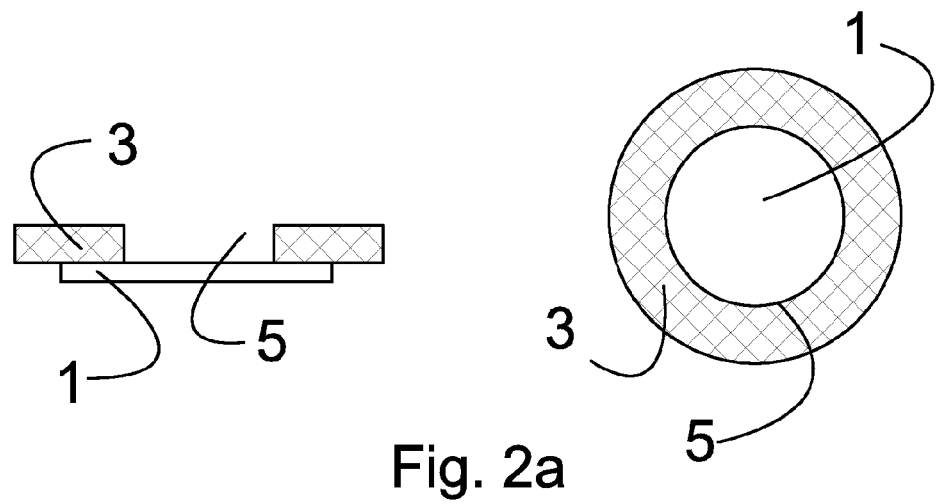
Figure 2B:
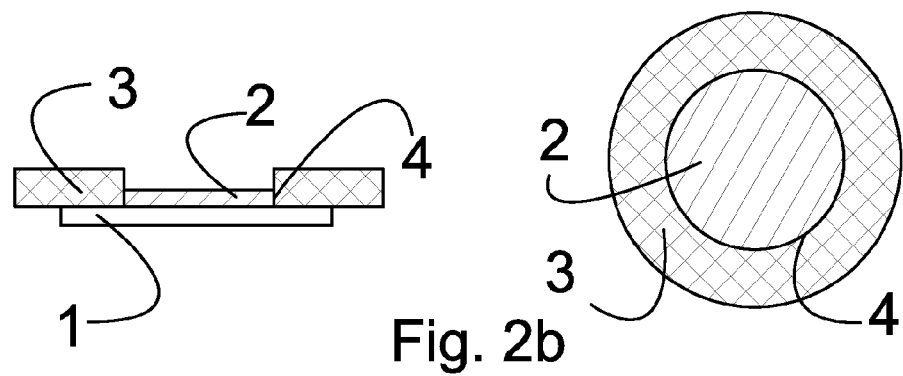
Figure 2C:
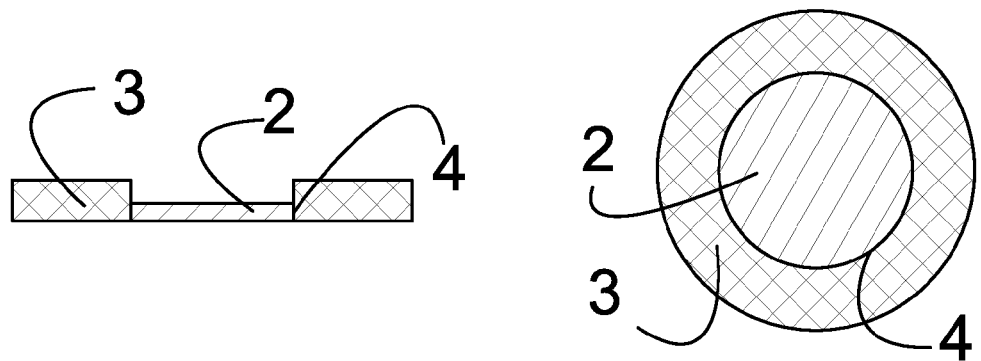
Figure 3A:
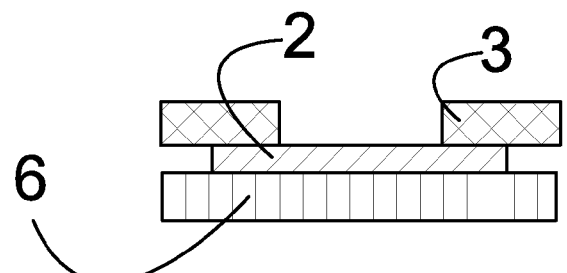
Figure 3B:
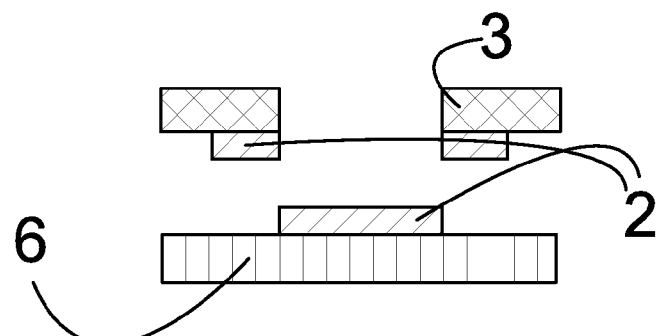
Figure 3C:
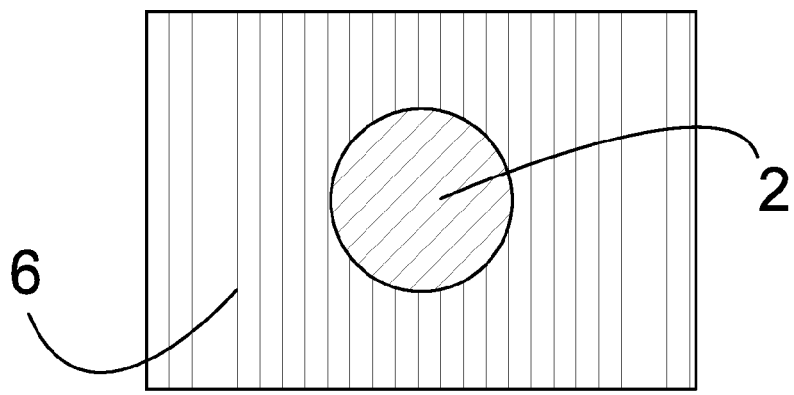
Figure 4:
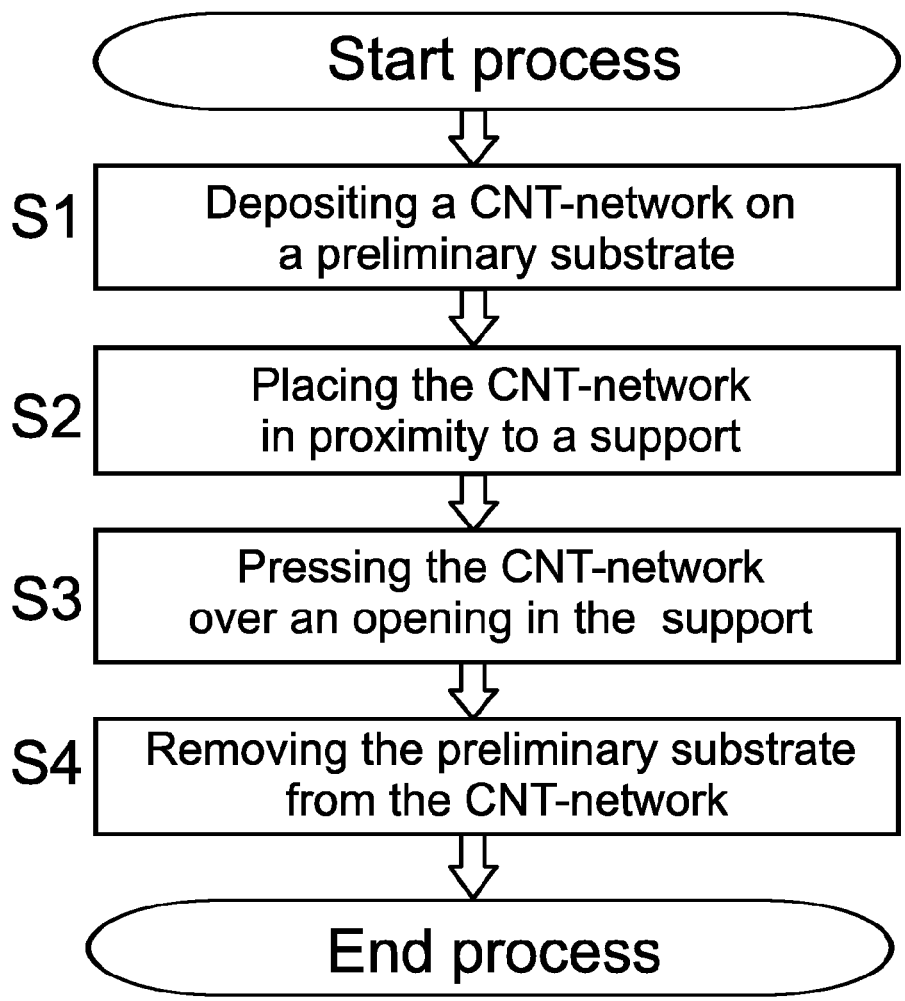

In the following, the present invention will be described in more detail with exemplary embodiments by referring to the accompanying figures, in which FIG. 1a is the first figure in the series of FIGS. 1a-1d schematically illustrating the fabrication of a product according to one embodiment of the present invention, FIG. 1b is the second figure in the series of FIGS. 1a-1d schematically illustrating the fabrication of a product according to one embodiment of the present invention, FIG. 1c is the third figure in the series of FIGS. 1a-1d schematically illustrating the fabrication of a product according to one embodiment of the present invention, FIG. 1d is the fourth figure in the series of FIGS. 1a-1d schematically illustrating the fabrication of a product according to one embodiment of the present invention, FIG. 2a is the first figure in the series of FIGS. 2a-2c schematically illustrating the fabrication of a product according to one embodiment of the present invention, FIG. 2b is the second figure in the series of FIGS. 2a-2c schematically illustrating the fabrication of a product according to one embodiment of the present invention, FIG. 2c is the third figure in the series of FIGS. 2a-2c schematically illustrating the fabrication of a product according to one embodiment of the present invention, FIG. 3a is the first figure in the series of FIGS. 3a-3c schematically illustrating the fabrication of a product according to one embodiment of the present invention, FIG. 3b is the second figure in the series of FIGS. 3a-3c schematically illustrating the fabrication of a product according to one embodiment of the present invention, FIG. 3c is the third figure in the series of FIGS. 3a-3c schematically illustrating the fabrication of a product according to one embodiment of the present invention, and FIG. 4 is a flow chart presentation of a method according to one embodiment of the present invention.

Figure 5:
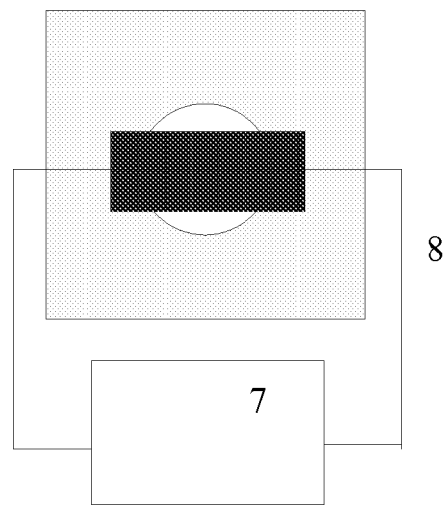

FIG. 5 is a demonstration of a loud speaker made of free standing CNT film.

For reasons of simplicity, item numbers will be maintained in the following exemplary embodiments in the case of repeating components.

FIGS. 1a to 1d are a series of figures schematically illustrating the fabrication procedure of a product according to one embodiment of the present invention. The left side schematic in each of the figures is a cross sectional view of the structure in a direction perpendicular to the surface of the planar preliminary substrate 1. The right side schematic in each of the figures is a top plane view of the structure. A flow chart illustration of the corresponding method is presented in FIG. 4.

In FIGS. 1a and 1b a network 2 of essentially randomly oriented CNTs (in this and in the following embodiments of the invention a network 2 comprising HARM-structures other than CNTs may also be considered) is deposited on the preliminary substrate 1 (step S1 in FIG. 4). In FIG. 1c a slide-like planar support 3 with a circular opening (hole) 5 in the middle is brought into close proximity with the CNT-network 2 and pressed against it (steps S2 and S3 in FIG. 4). The peripheral region 4 of the network 2 (or of the opening 5) comes into contact with the support (or with the network 2), and the network 2 covers the opening 5 in the slide-like support 3. Finally, in FIG. 1d, the preliminary substrate 1 is removed from contact with the CNT-network 2 (step S4 in FIG. 4). This step is enabled by the stronger adhesion of the network 2 to the support 3 than to the preliminary substrate 1, resulting from the higher surface energy of support 3 compared to the preliminary substrate 1. The difference in the surface energy of the preliminary substrate 1 and of the support 3 enables the removal of the preliminary substrate 1 from the structure easily without risking rupturing of the network 2. Also, an attractive force caused by an e.g. electrostatic force, a centripetal force, adhesive forces or drag, can be used to attract the network 2 to the support 3 from the preliminary substrate 1.

FIGS. 2a to 2c are a series of figures schematically illustrating the fabrication procedure of a product according to one embodiment of the present invention. The left side schematic in each of the figures is a cross sectional view of the structure in a direction perpendicular to the surface of the planar preliminary substrate 1. The right side schematic in each of the figures is a top plane view of the structure.

In FIGS. 2a and 2b a network 2 of essentially randomly oriented CNTs is deposited on the preliminary substrate 1, which, in this embodiment, is close or in contact with the support 3 prior to deposition. The network 2 is deposited on the preliminary substrate 1 and into the opening 5 of the support 3. This can be achieved by a selective deposition process or by patterning of the network 2 after deposition with common patterning techniques. Selective deposition of the network 2 can be achieved by e.g. suitably choosing the materials of the support 3 and of the preliminary substrate 1. The preliminary substrate 1 can be of e.g. porous material which allows flow through of gases whereas the support 3 would be solid nonporous material. A network 2 comprising CNTs can then be selectively deposited into the opening 5 from gas phase by guiding a gas stream comprising the CNTs through the porous preliminary substrate 1, whereas deposition of CNTs does not occur on the nonporous support as the CNT molecules only flow by the support. In this embodiment, the peripheral region 4 of the network 2 (or of the opening 5) comes into contact with the support 3 (or with the network 2), and the network 2 adheres on the vertical sidewalls forming the peripheral region 4 (see FIG. 2b and FIG. 2c) of the opening 5. Hence the network 2 covers the opening 5 in the support 3. To obtain the semi free-standing network 2 of FIG. 2c the preliminary substrate 1 can finally be easily removed from the structure. This is enabled by the stronger adhesion of the network 2 to the support 3 than to the preliminary substrate 1, resulting from the higher surface energy of support 3 compared to the preliminary substrate 1.

The partly (semi) free-standing film can be further modified by e.g. densification with ethanol in liquid or vapor form. The semi free-standing film can also be functionalized with chemical treatment, such as nitric acid, in liquid or vapor form, or by deposition of particles, such as nanoparticles, into the network 2, or by deposition of films onto the network 2 by techniques such as CVD, ALD or sputtering. The modification can be carried out by e.g. placing the network 2 on the support 3 in a gas flow, and then guiding processing gases through the network 2 and through the opening 5 in the support 3.

The aforementioned modification (processing) can be used, for instance, to change the absorption efficiency, transparency, reflectivity, thermal or electrical conductivity, mechanical strength, flexibility or elasticity, or chemical activity of the network 2. With suitable processing the semi free-standing film can be used as, for instance, an optical element in a laser or a light pulse shaper, a free-standing thermal audio loudspeaker, an aerosol particle or gas filter, pressure, flow, particle or gas sensor, or a receiver or an antenna.

Moreover, the semi free-standing film structure can be used to create a deposit on a tertiary substrate 6 having a surface on which direct deposition is difficult. These surfaces can be surfaces with e.g. a low surface energy (e.g. lower than the preliminary substrate 1), or a rough surface morphology. Deposition on these surfaces can by accomplished by first producing the semi free-standing structure and then placing the network 2 in close proximity to the tertiary substrate 6 such that the film is attracted to the tertiary substrate 6.

In practice the network 2 can be transferred on a tertiary substrate 6 having a low surface energy by e.g. pressing the network 2 on the support 3 against the tertiary substrate 6 and cutting off the free-standing region of the network 2 residing over the opening 5 of the support 3. The aforementioned procedure of depositing on a tertiary substrate 6 is schematically illustrated by the series of FIGS. 3a-3c. FIG. 3a and FIG. 3b schematically illustrate a cross section of the layered structure during the procedure and FIG. 3c is a schematic top view of the end product of the procedure. FIG. 3b presents how the network 2 is cut before transferring the network 2 onto the tertiary substrate 6. The cutting of the network can be easily performed via the opening 5 in the support 3. One or more regions of the network 2 may be left on the support 3 after the transfer.

The partly (semi) free-standing structure lends itself well to gas-phase processing and modification as the network 2 on the support 3 can be placed in a gas flow, and the processing gases can be easily guided through the network 2 and through the opening 5 in the support 3. Such a method can be used to, for instance, deposit a secondary material either by, for instance, heterogeneous nucleation (condensation) or mechanical filtration on or into the network 2. This kind of technique can also be used to, for instance, fabricate composite networks 2 comprising e.g. nanoparticles and HARM structures. In this case the nanoparticles can be filtered from gases guided through the network 2. The nanoparticles in the network 2 can serve, for instance, to increase the conductivity of the network 2. Resistive heating can be used to further modify the composite network 2.

EXAMPLE 1

SWCNTs (single walled carbon nanotubes) were synthesized in an aerosol laminar flow (floating catalyst) reactor using carbon monoxide and ferrocene as a carbon source and a catalyst precursor, respectively. SWCNT mats were then collected directly from the gas phase downstream of the reactor by filtering through 2.45 cm diameter nitrocellulose (or silver) disk filters (Millipore Corp, USA). In the following examples the filter takes the role of the preliminary substrate 1 though other means of obtaining the network 2 of fibrous material on the preliminary substrate 1 are possible according to the invention. Details of the synthesis process of the SWCNTs can be found e.g. in patent application publication WO 2005/085130, which is included as a reference herein.

The deposition temperature on the filter surface (preliminary substrate 1) was measured to be 45° C. The layer thickness of networks 2 of SWCNTs was controlled by the deposition time, which could be altered from a few minutes to several hours depending on the desired network thickness. The deposits collected on filters 1 were networks 2 of SWCNTs with random orientation.

Subsequently physical compression was used to transfer a network 2 onto a support 3. Compression may be achieved by, e.g. applying a force between two parallel plates wherein the preliminary substrate 1 containing the network 2 and the support 3 are placed in between the parallel plates. The preliminary substrate 1 was aligned such that the peripheral region 4 of the network 2 (or of the opening 5) came into contact with the support 3 (or with the network 2) and the middle part of the network 2 covered the opening 5 in the support 3, as the network 2 was compressed in between the preliminary substrate 1 and the support 3.

The SWCNT networks 2 were transferred to polyethylene terephthalate (PET) polymer film supports 3 (by DuPont Teijin) having an opening 5 in the middle part of the film. This material was chosen because of its suitable flexibility and surface energy.

For the transfer and integration of CNT-networks 2 onto the PET film supports 3, the HARM-structures (CNTs in this case) were first deposited on the preliminary substrate 1. After compression the preliminary substrate 1 was removed from contact with the CNT-network 2.

In further processing, and according to another embodiment of the present invention, the network 2 of CNTs may be densified either on the preliminary substrate 1 or on the support 3 by an intercalation material, e.g. ethanol.

In the aforementioned example, the filter acted as the preliminary substrate 1, the PET film acted as the support 3, and the differential in adhesive van der Waals force (and in surface energy) was used to transfer the network 2 from the preliminary substrate 1 onto the peripheral region 4 of the support 3 and over the opening 5 of the support 3. Densification by ethanol was used to modify the SWCNT network 2.

The PET film support 3 having an opening 5 in the middle part of the film was placed on a flat surface. Then, the preliminary substrate 1 coated with a CNT network 2 was placed in close proximity to the PET film support 3 and a force was applied to press the network 2 against the PET support at the peripheral region 4 of the network 2 (or of the opening 5) for about 5-10 s. After removing the preliminary substrate 1 from the network 2, the CNT network 2 was surprisingly found to robustly reside over the opening 5 of the PET film support 3, as a semi free-standing film.

EXAMPLE 2

Loud Speaker

A film of randomly oriented freestanding CNTs was transferred over a hole (FIG. 5) on a PET substrate. A power source 7 (a microphone jack on a computer) was attached to drive a varying current through the CNTs via electric wires 8.

Aerosol Filter

Due to high porosity and strength, randomly oriented freestanding CNT films were utilized as aerosol filters. For that purpose, CNT film was attached to a substrate to cover the hole completely. In this case aerosol particles were captured by passing the flow through the film. Depending on the particle diameter and flow rate the efficiency and quality factor of the filter were in the ranges 99.5-99.9998% and 20-120. The efficiency was estimated as $$E = \frac{C_{in} - C_{out}}{C_{in}} 100\%,$$

where $C_{in}$ and $C_{out}$ are the aerosol concentration entering and leaving the filter. The quality of filters can be estimated on the basis of its efficiency and for a given particle size and the pressure drop, $\Delta p$:

$$q_F = -\frac{\ln(1-E)}{\Delta p}$$

The greater the value of the filter quality the better the filter is [Hint].

Incandescent Lamp

Free standing CNTs films were used as a filament in an Incandescent lamp. For that purpose, to obtain light the film of CNTs was hanging between two tungsten wires and resistively heated up to 1200-1400 C using either direct or alternating current. Due to their random orientation, and many interconnects, the film remained intact even at 1400 C and the emitted light remained uniform over the entire film.

Saturable Absorber

Another important functionality of the free standing SWNT films can be illustrated as a laser component—saturable absorber. A key element in the mode-locked fiber laser cavity is the nonlinear element initiating the pulsed operation. We demonstrated a free-standing SWNT film to mode-lock a fiber laser operating at the wavelengths of 1.0, 1.6 and 2.0 μm.

Chemical Sensor

Another application of the free standing CNT film can be found in electroanalysis as an electrode material. Due to their unique properties such as high conductivity, surface area, electrochemical stability, low background currents and electrocatalytic properties, CNTs were used for electrochemical sensing. We showed excellent sensing properties of the freestanding SWNT electrodes for the electrochemical detection of glucose and dopamine. The CNT film was transferred to PET substrate with a hole to completely cover it. The contact with CNTs and wiring was prepared using silver conductive paste and kept outside of the solution. The CNT film sensor demonstrated a wide concentration range (from 0.1 to 100 μM) and extremely low detection limit (about 100 nM).

As is clear for a person skilled in the art, the invention is not limited to the examples described above but the embodiments can freely vary within the scope of the claims.

The invention claimed is:

1. A method for fabricating a structure comprising high aspect ratio molecular structures (HARM-structures), wherein the method comprises the steps of
fabricating an essentially planar network of essentially randomly oriented HARM-structures on a preliminary substrate by depositing HARM-structures onto the preliminary substrate from a gas phase,
bringing the network on the preliminary substrate in proximity to a support having an opening therein;
transferring the network onto the support, such that the network contacts the support at the peripheral region of the opening in the support, and the middle part of the network is unsupported by the support; and
removing the preliminary substrate from the network.

2. The method of claim 1, wherein the step of bringing the network on the preliminary substrate in proximity to a support having an opening therein, comprises depositing the network onto the preliminary substrate being in proximity to the support.

3. The method of claim 1, wherein the method comprises the step of
placing the network on the support into gas flow, such that gas is guided through the network and through the opening in the support, for modifying the network.

4. The method of claim 1, wherein the method comprises the step of
placing liquid onto the network on the support such that the liquid is wicked to cover the network.

5. The method of claim 4, wherein the liquid is a solvent in which a solute is dissolved in it.

6. The method of claim 1, wherein the method comprises the steps of
placing the network residing on the support into contact with a tertiary substrate, wherein the surface energy of the tertiary substrate is lower than the surface energy of the preliminary substrate, and
transferring the network from the support to the tertiary substrate.

* * * * *

UNITED STATES PATENT AND TRADEMARK OFFICE
CERTIFICATE OF CORRECTION

| | | |
|---|---|---|
| PATENT NO. | : 9,133,022 B2 | Page 1 of 1 |
| APPLICATION NO. | : 13/146249 | |
| DATED | : September 15, 2015 | |
| INVENTOR(S) | : Brown et al. | |

It is certified that error appears in the above-identified patent and that said Letters Patent is hereby corrected as shown below:

Specification

Col. 2, lines 6-11, cancel the text: "The product according to the present invention is characterized by what is presented in independent claim 1.

The method according to the present invention is characterized by what is presented in independent claim 4.

The use according to the present invention is characterized by what is presented in claim 10."

Signed and Sealed this
Fifteenth Day of March, 2016

Michelle K. Lee
*Director of the United States Patent and Trademark Office*